(12) United States Patent
Shin

(10) Patent No.: US 7,990,189 B2
(45) Date of Patent: Aug. 2, 2011

(54) POWER-UP SIGNAL GENERATING CIRCUIT AND INTEGRATED CIRCUIT USING THE SAME

(75) Inventor: Yoon-Jae Shin, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 134 days.

(21) Appl. No.: 12/345,846

(22) Filed: Dec. 30, 2008

(65) Prior Publication Data

US 2010/0109723 A1    May 6, 2010

(30) Foreign Application Priority Data

Nov. 4, 2008   (KR) .......................... 10-2008-0108904

(51) Int. Cl.
*H03L 7/00* (2006.01)
(52) U.S. Cl. ........................................ 327/142; 327/198
(58) Field of Classification Search .................. 327/142, 327/143, 198
See application file for complete search history.

(56) References Cited

U.S. PATENT DOCUMENTS

| | | | | |
|---|---|---|---|---|
| 6,784,705 B2 * | 8/2004 | Kamata | ......................... | 327/143 |
| 7,606,105 B2 * | 10/2009 | Chu | .............................. | 365/227 |
| 2007/0070772 A1 * | 3/2007 | Song et al. | .................... | 365/226 |
| 2008/0309407 A1 * | 12/2008 | Nakamura et al. | ............ | 330/253 |

FOREIGN PATENT DOCUMENTS

| KR | 1020030027198 A | 4/2003 |
|---|---|---|
| KR | 1020030052362 A | 6/2003 |

OTHER PUBLICATIONS

Notice of Allowance issued from Korean Intellectual Property Office on Mar. 29, 2010.

* cited by examiner

*Primary Examiner* — Lincoln Donovan
*Assistant Examiner* — Daniel Rojas
(74) *Attorney, Agent, or Firm* — IP & T Group LLP

(57) ABSTRACT

A power-up signal generating circuit includes a detecting unit configured to output a bias signal having a voltage level corresponding to an external power voltage in response to an internal voltage and a deep power down (DPD) signal; and a signal generating unit configured to generate a power-up signal having a logic level corresponding to the voltage level of the external power voltage in response to the DPD signal and the bias signal, wherein the internal voltage increases during an activation time of the power-up signal to reach a predetermined voltage level after a predetermined time, and maintains a ground voltage level during an inactivation period of the power-up signal.

9 Claims, 3 Drawing Sheets

POWER-UP SIGNAL GENERATING CIRCUIT AND INTEGRATED CIRCUIT USING THE SAME

CROSS-REFERENCE TO RELATED APPLICATION

The present invention claims priority of Korean patent application number 10-2008-0108904, filed on Nov. 4, 2008, which is incorporated by reference in its entirety.

BACKGROUND OF THE INVENTION

The present invention relates to a semiconductor design technique, and more particularly, to a power-up signal generating circuit and an integrated circuit using the same for generating a power-up signal.

In general, an integrated circuit performs a specific operation according to a various operation mode, and maintains a voltage level of an internal voltage outputted from an internal power circuit as a ground voltage level to minimize a current consumption in a deep power down (DPD) mode. The integrated circuit has a circuit for generating a power-up signal as a start control signal which is used for initializing an internal circuit when a power voltage provided from an external is increased to a predetermined level and stabilized.

In a normal operation mode, the power-up signal is activated, resets a latch of an internal circuit, activates an internal power circuit, and controls an internal voltage to be supplied with a predetermined voltage level. Moreover, in the DPD mode, the power-up signal is inactivated, disables the internal power circuit, and controls the internal voltage to be maintained as a ground voltage level.

FIG. 1 is a block diagram illustrating a conventional power-up signal generating circuit.

As shown, a conventional power-up signal generating circuit includes a detecting unit 110 and a signal generating unit 120. The detecting unit 110 outputs a bias signal BIAS having a voltage level corresponding to an external power voltage VDD in response to a DPD signal. The signal generating unit 120 generates a power-up signal PWRUP_PRE having a logic level corresponding to the external power voltage VDD in response to the DPD signal and the bias signal BIAS.

A detailed configuration and operation of the conventional power-up signal generating circuit will be described below.

The detecting unit 110 generates a bias signal BIAS having a voltage level corresponding to the external power voltage VDD based on a normal operation mode and a DPD mode in response to a DPD signal. That is, when the DPD signal is a logic low, the detecting unit 110 generates the bias signal BIAS under the normal operation mode, and when the DPD signal is a logic high, the detecting unit 110 generates the bias signal under the DPD mode.

The detecting unit 110 includes a first PMOS transistor MP1, a plurality of first voltage drop elements R1, R2 and R3, a plurality of second voltage drop elements R4, R5 and R6, a first NMOS transistor MN1 and a capacitor CAP1. The first PMOS transistor MP1 is coupled between the external power voltage VDD and a first node N1, and controlled by the DPD signal. The plurality of first voltage drop elements R1, R2 and R3 are coupled between the first node N1 and an output terminal NO of the bias signal BIAS. The plurality of second voltage drop elements R4, R5 and R6 are coupled between the output terminal NO of the bias signal BIAS and a ground voltage VSS terminal. The first NMOS transistor NM1 is connected between a ground voltage VSS terminal and the output terminal NO of the bias signal BIAS, and controlled by the DPD signal. The capacitor CAP1 is coupled between the ground voltage VSS terminal and the output terminal NO of the bias signal.

The signal generating unit 120 generates a power-up signal PWRUP_PRE having a logic level corresponding to the external power voltage VDD in response to the DPD signal and the bias signal BIAS.

The signal generating unit 120 includes a plurality of PMOS transistors MP2, MP3 and MP4, a plurality of NMOS transistors MN2 and MN3, a NOR logic circuit NOR1, a first inverter INV1 and a second inverter INV2. The plurality of PMOS transistors MP2, MP3 and MP4 are connected between the external power voltage VDD and a second node N2. Gates of the plurality of PMOS transistors MP2, MP3 and MP4 are coupled to the ground voltage VSS terminal. A plurality of NMOS transistors MN2 and MN3 are coupled between the second node N2 and the ground voltage VSS terminal in series, and are controlled by the bias signal BIAS. The NAND logic circuit NOR1 receives output signals of the second node N2 and the DPD signal. The first inverter INV1 inverts an output signal of the NOR logic circuit NOR1. The second inverter INV2 inverts an output signal of the first inverter INV1.

When the DPD signal is a logic low level, the power-up signal generating circuit operates under a normal operation mode. Because the first PMOS transistor MP1 controlled by the DPD signal is turned on, a voltage level of the output terminal NO depends on a resistance value ratio of first voltage drop elements R1, R2 and R3 and second voltage drop elements R4, R5 and R6. Accordingly, when a power is supplied from an external and a voltage level of an external power voltage VDD is increased from the ground voltage level to the external power voltage VDD, the voltage level of the output terminal NO depends on a resistance value ratio of voltage drop elements. That is, a bias signal BIAS output from the output terminal NO is output by dividing the voltage of a supply power through the voltage drop elements.

Moreover, during a start time of a power supply, a voltage level of the second node N2 of the signal generating unit 120 maintains the voltage level supplied from the external power voltage VDD because the PMOS transistors MP2, MP3 and MP4 of the signal generating unit 120 are turned on. If the voltage level of the bias signal BIAS is increased higher than a predetermined level, the NMOS transistors MN2 and MN3 of the signal generating unit 120 are turned on, and the voltage level of the second node N2 is decreased to the ground voltage level VSS.

The first NOR logic circuit NOR1 outputs an output signal having a logic level in response to the voltage level of the output signal of the second node N2 because the DPD signal is a logic low level. Finally, a power-up signal PWRUP_PRE is output through the first inverter INV1 and the second inverter INV2. In short, if the voltage level of the external power voltage VDD is increased higher than a predetermined level, the power-up signal PWRUP_PRE is activated and output as a logic high level.

And then, the signal level of the DPD signal is changed from a logic low level to a logic high level, and the power-up signal generating circuit operates under DPD mode. Since the first PMOS transistor MP1 controlled by the DPD signal is turned off and the first NMOS transistor MN1 is turned on, the voltage level of the output terminal NO is decreased to the ground voltage VSS. That is, the bias signal BIAS is decreased to the voltage level of the ground voltage VSS. Accordingly, the NMOS transistors MN2 and MN3 of the signal generating unit 120 are turned off and the voltage level of the second node N2 is increased to a level of the external power voltage VDD.

Because the DPD signal is a logic high level, the first NOR logic circuit NOR1 outputs a logic low level irrespective of the voltage level of the output signal from the second node N2. Finally, the power-up signal PWRUP_PRE is output through the first inverter INV1 and the second inverter INV2. That is, the power-up signal PWRUP_PRE is inactivated and output as the logic low level.

On the contrary, when the DPD mode is changed to a normal operation mode, because the DPD signal is transitioned from a logic high level to a logic low level, the first PMOS transistor MP1 is turned on and the voltage level of the output terminal NO is increased. That is, the voltage level of the bias signal BIAS is increased higher than a predetermined level, the NMOS transistors MN2 and MN3 of the signal generating unit 120 are turned on, and the second node N2 is decreased to the ground voltage level VSS.

Because it takes time to sufficiently charge a capacitor which is coupled to the output terminal NO, the turn-on time of the NMOS transistors MN2 and MN3 is delayed for a predetermined time. Accordingly, the power-up signal PWRUP_PRE is not activated directly and is delayed for a predetermined time.

SUMMARY OF THE INVENTION

Exemplary embodiments of the present invention are directed to providing a power-up signal generating circuit and an integrated circuit configured to improve a generation speed of a power-up signal when a DPD mode is changed to a normal operation mode.

Exemplary embodiments of the present invention are also directed to providing a power-up signal generating circuit and an integrated circuit configured to reduce a current consumption and a circuit area under a DPD mode.

In accordance with an aspect of the present invention, there is provided a power-up signal generating circuit, including a detecting unit configured to output a bias signal having a voltage level corresponding to an external power voltage in response to an internal voltage and a deep power down (DPD) signal; and a signal generating unit configured to generate a power-up signal having a logic level corresponding to the voltage level of the external power voltage in response to the DPD signal and the bias signal, wherein the internal voltage increases during an activation time of the power-up signal to reach a predetermined voltage level after a predetermined time, and maintains a ground voltage level during an inactivation period of the power-up signal.

In accordance with another aspect of the present invention, there is provided an integrated circuit, including a detecting unit configured to output a bias signal having a voltage level corresponding to an external power voltage in response to an internal voltage and a deep power down (DPD) signal; a power-up signal generating unit configured to generate a power-up signal having a logic level corresponding to the voltage level of the external power voltage in response to the DPD signal and the bias signal; and an internal voltage generating unit configured to generate the internal voltage in response to the power-up signal, wherein the internal voltage increases during an activation time of the power-up signal reach a predetermined voltage level after a predetermined time, and maintains a ground voltage level during an inactivation period of the power-up signal.

When a DPD mode is changed to a normal operation mode, because a power-up signal is activated and generated without a time delay, a response speed of an internal circuit which operates in response to a power-signal is improved. Especially, an internal voltage of various voltage levels which are outputted from at least one internal power circuit controlled by the power-up signal is stabilized within a short time. Moreover, the power-up signal generating circuit of the present invention is configured to decrease a leakage current of a transistor maximally and reduces an occupied area of the integrated circuit.

DESCRIPTION OF SPECIFIC EMBODIMENTS

Hereinafter, an internal generation circuit of a semiconductor memory device in accordance with the present invention will be described in detail with reference to the accompanying drawings.

In general, a logic signal of a circuit has a logic high level H or a low level L corresponding to a voltage level and may be expressed as '1' and '0'. Also, it may be defined that the logic signal of the circuit may additionally have a high impedance level HI-Z state. Furthermore, a P-channel Metal Oxide Semiconductor (PMOS) and an N-channel Metal Oxide Semiconductor (NMOS) used in an embodiment of the present invention are a sort of a Metal Oxide Semiconductor Field-Effect Transistor (MOSFET).

Figure 1:
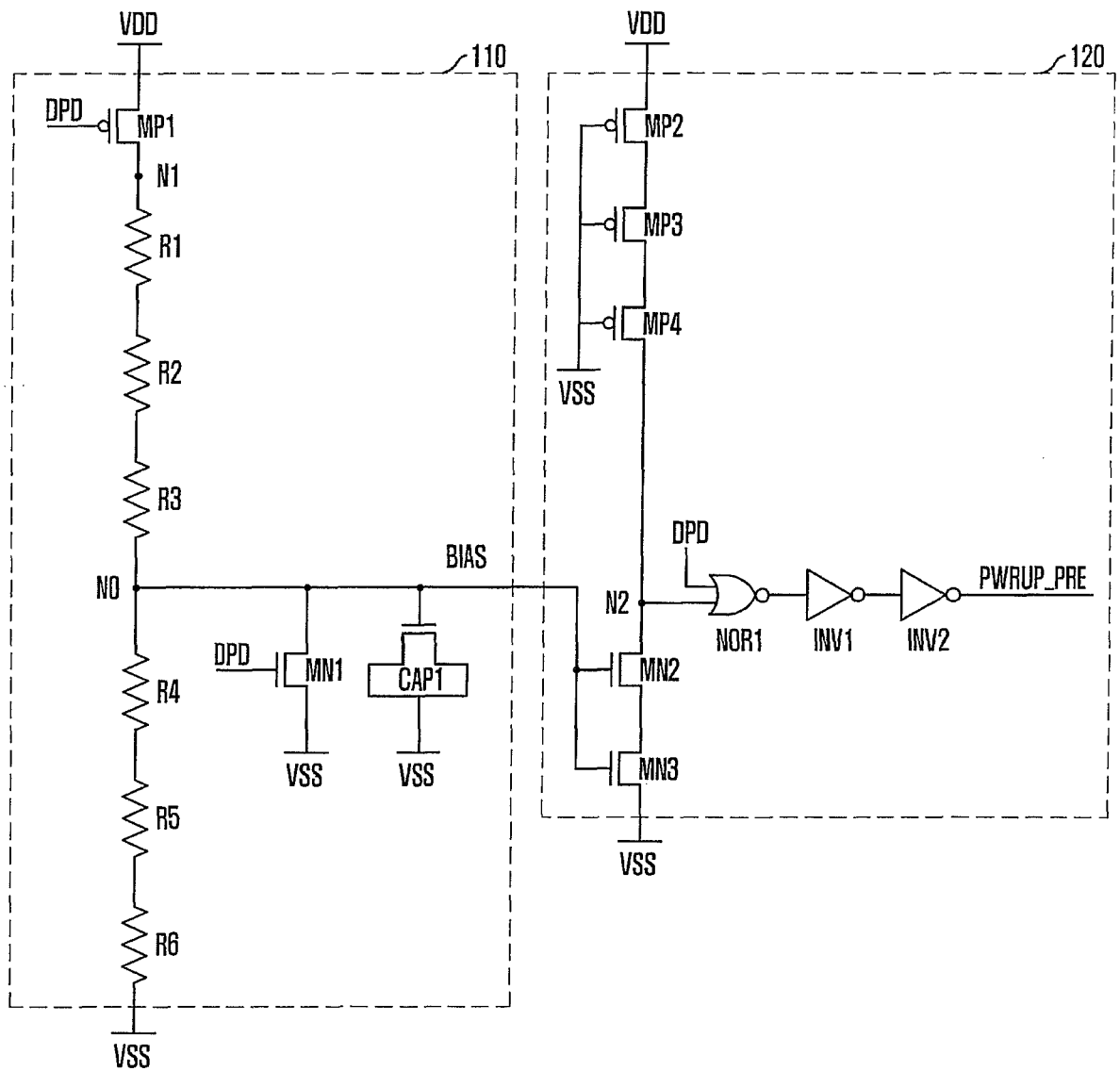
FIG. 1 is a block diagram illustrating a conventional power-up signal generating circuit.
Figure 2:
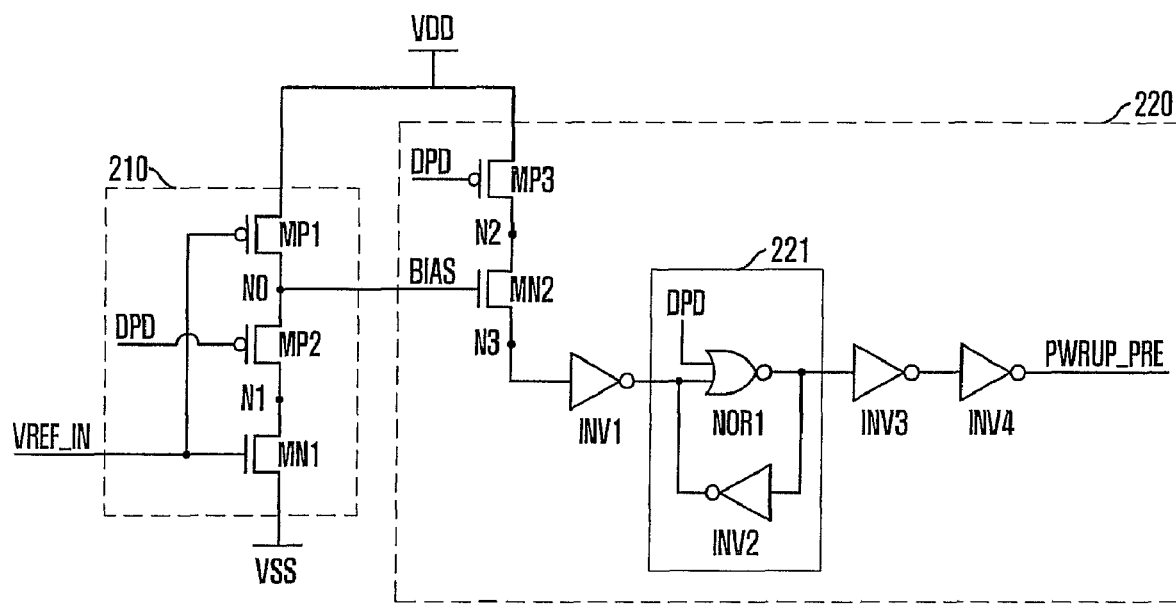
FIG. 2 is a block diagram illustrating a power-up signal generating circuit in accordance with an embodiment of the present invention.

FIG. 2 is a block diagram illustrating a power-up signal generating circuit in accordance with an embodiment of the present invention.

As shown, the power-up signal generating circuit includes a detecting unit 210 and a signal generating unit 220. The detecting unit 210 outputs a bias signal BIAS having a voltage level corresponding to a voltage level of an external power voltage VDD in response to an internal voltage VREF_IN and a Deep Power Down (DPD) signal. The signal generating unit 220 generates a power-up signal PWRUP_PRE having a logic level corresponding to a voltage level of the external power voltage VDD in response to the bias signal BIAS and the DPD signal. A voltage level of the internal voltage VREF_IN increases at an activation time of the power-up signal PWRUP_PRE and reaches a predetermined voltage level after a predetermined time. The voltage level of the internal voltage VREF_IN is maintained as a ground voltage level VSS during an inactivation period of the power-up signal PWRUP_PRE. An internal reference voltage is used as the internal voltage VREF_IN.

A configuration and operation of the power-up signal generating circuit will be described in detail hereafter.

The detecting unit 210 generates the bias signal BIAS according to a normal operation mode and a DPD mode. That is, when the DPD signal is a logic low level, the detecting unit 210 generates the BIAS signal under the normal operation mode, and when the DPD signal is a logic high level, the detecting unit 210 generates the BIAS under the DPD mode.

The detecting unit 210 includes a first PMOS transistor MP1, a second PMOS transistor MP2, and a first NMOS transistor NM1. The first PMOS transistor MP1 is coupled between the external power voltage VDD and an output terminal NO of the bias signal BIAS, and is controlled by the internal voltage VREF_IN. The second PMOS transistor MP2 is coupled between the output terminal NO of the bias signal BIAS and the first node N1, and controlled by the DPD signal. The first NMOS transistor MN1 is coupled between the first node N1 and a ground voltage VSS, and controlled by the internal voltage VREF_IN.

The signal generating unit 220 generates the power-up signal PWRUP_PRE having a logic level corresponding to a voltage level of the external power voltage VDD in response to the bias signal BIAS and a DPD signal.

The signal generating unit 220 includes a third PMOS transistor MP3, a second NMOS transistor MN2, a first inverter INV1, and a latch unit 221. The third PMOS transistor MP3 is coupled between the external power voltage VDD and a second node N2, and controlled by the DPD signal. The second NMOS transistor is connected between the second node N2 and a third node N3, and controlled by the bias signal BIAS. The first inverter INV1 inverts an output signal of the third node N3. The latch unit 221 latches an output signal of the first inverter INV1 in response to the DPD signal. The latch unit 221 includes a NOR logic circuit NOR1 and a second inverter INV2. The NOR logic circuit NOR1 receives the DPD signal through a first input terminal and receives an output of the first inverter INV1 through a second input terminal. The second inverter INV2 inverts the output signal of the NOR logic circuit NOR1, and outputs an inverted output signal to the second input terminal of the NOR logic circuit NOR1. A NOR gate is used as the NOR logic circuit NOR1. Moreover, the signal generating unit 220 may further include a third inverter INV3 and a fourth inverter INV4. The third inverter INV3 inverts an output signal of the latch unit 221. The fourth inverter INV4 inverts an output signal of the third inverter INV3.

Firstly, when the DPD signal is a low level, the power-up signal generating circuit operates under the normal operation mode. While a power is supplied from an external and the voltage level of the external power voltage VDD is increased from the ground voltage level to the level of the external power voltage VDD, an internal operation of the power-up signal generating circuit will be described below.

When an external power is supplied, the power-up signal PWRUP_PRE is inactivated to a logic low level and the internal voltage VREF_IN is maintained at the logic low level. Accordingly, the first PMOS MP1 transistor is turned on and the first NMOS transistor MN1 is turned off in response to the internal voltage VREF_IN. The voltage level of the output terminal NO is increased corresponding to the voltage level of the external power voltage VDD. That is, the voltage level of the bias signal BIAS output from the output terminal NO is increased little by little. Because the DPD signal is the logic low level, the second PMOS transistor MP2 and the third PMOS transistor MP3 are maintained under a turn-on state.

If the voltage level of the bias signal BIAS increases higher than a predetermined level, the second NMOS transistor MN2 is turned on and the voltage level of the third node N3 increases corresponding to the voltage level of the external power voltage VDD. Accordingly, when a power is supplied from an external and the voltage level of the external power voltage terminal increases higher than a predetermined level, the power-up signal PWRUP_PRE is activated and output from a logic low level to a logic high level.

On the contrary, when the power-up signal PWRUP_PRE is activated to a high level, the voltage level of the internal voltage VREF_IN increase and reaches a predetermined voltage level after a predetermined time. Accordingly, the first PMOS transistor MP1 is turned off in response to the internal voltage VREF_IN. The first NMOS transistor NM1 is turned on and the bias signal BIAS decreases to the ground voltage level VSS. The second NMOS transistor MN2 is turned off in response to the bias signal BIAS. The latch unit 221 activates the power-up signal PWRUP_PRE to be output as a logic high level.

If the level of the DPD signal is changed from a logic high level to a logic low level, the power-up signal generating circuit operates under the DPD mode. Because the DPD signal is a logic high level, a second PMOS transistor MP2 and a third PMOS transistor controlled by the DPD signal are turned off. Moreover, since the DPD signal input to the NOR logic circuit NOR1 of the latch unit 221 is a logic high level, the latch unit 221 outputs a signal of a logic low level, and the power-up signal PWRUP_PRE, which is finally output, has a logic low level.

When the power-up signal PWRUP_PRE is activated to the logic low level, the internal reference voltage VREF_IN is dropped to the ground voltage level VSS. That is, the internal reference voltage VREF_IN has a logic low level. Accordingly, the first PMOS transistor MP1 controlled by the internal reference voltage VREF_IN is turned on, and the first NMOS transistor MN1 is turned off.

As mentioned above, a voltage provided from the external power voltage VDD is not applied to a drain of the first NMOS transistor NM1 and a drain of the second NMOS transistor NM2 under the DPD mode. Accordingly, a leakage current produced between the drain and a bulk of the NMOS transistor is reduced.

When the power supply mode is changed to the normal operation mode, the DPD signal transits from a logic high level to a logic low level, and the second PMOS transistor MP2 and the third PMOS transistor MP3 controlled by the DPD signal are turned on. The power-up signal PWRUP_PRE is inactivated to the logic low level and the internal voltage VREF_IN is maintained at the logic low level. Accordingly, the first PMOS transistor MP1 controlled by the internal voltage VREF_IN is turned on, the first NMOS transistor MN1 is turned off and the voltage of the output terminal NO increases. That is, the voltage level of the bias signal BIAS output from the output terminal NO increases. The second NMOS transistor MN2 controlled by the bias signal BIAS is turned on, the power-up signal PWRUP_PRE is activated and output as a logic high level.

A change of the internal voltage VREF_IN is used to output the power-up signal PWRUP_PRE to the activation level. Accordingly, when the DPD mode is changed to the normal operation mode, the power-up signal PWRUP_PRE is activated to the logic high level without delay.

Figure 3:
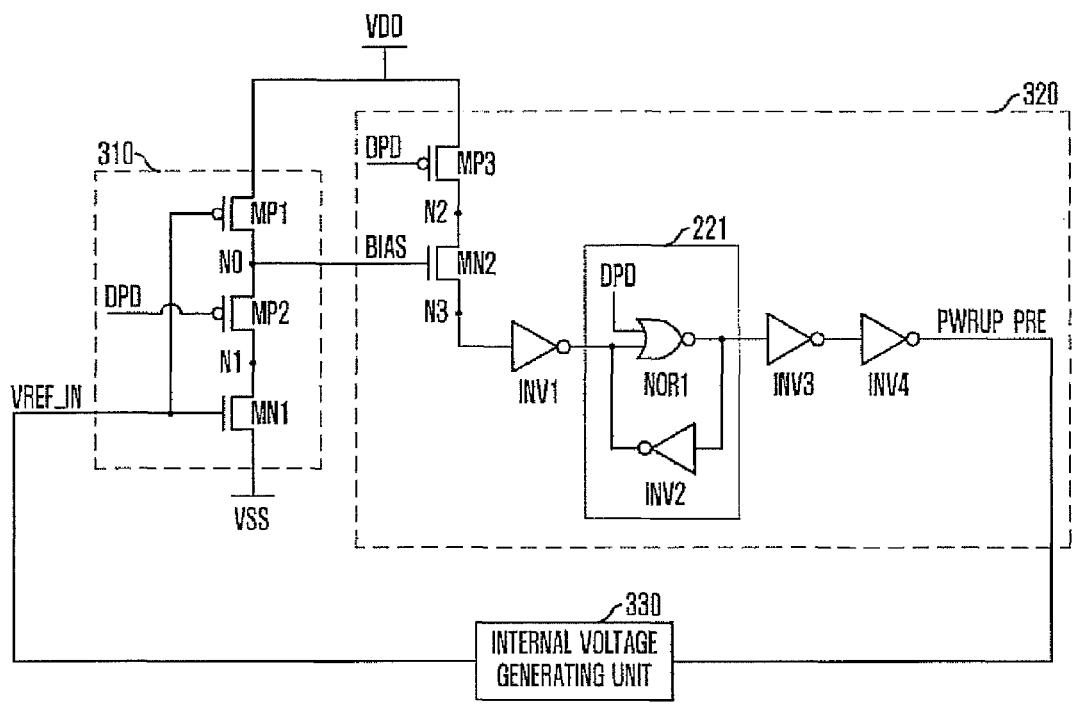
FIG. 3 is a block diagram illustrating an integrated circuit having a power-up signal generating circuit shown in FIG. 2 in accordance with an embodiment of the present invention.

Moreover, in reference to FIG. 3, an integrated circuit having a power-up signal generating circuit shown in FIG. 2 includes a detecting unit 310, a power-up signal generating unit 320 and an internal voltage generating unit 330, where the detecting unit 310 and the power-up signal generating unit 320 operate in the same way as the detecting unit 210 and the power-up signal generating unit 220.

The detecting unit 310 outputs the bias signal BIAS having a voltage level corresponding to the voltage level of the external power voltage VDD in response to the internal voltage VREF_IN and the DPD signal. The power-up signal generating unit 320 generates a power-up signal PWRUP_PRE having a logic level corresponding to the voltage level of the external power voltage VDD in response to the DPD signal and the bias signal BIAS. The internal voltage generating unit 330 generates the internal voltage VREF_IN in response to the power-up signal PWRUP_PRE. The internal voltage VREF_IN increases from an activation time of the power-up signal PWRUP_PRE, reaches a predetermined voltage level after a predetermined time, and is maintained at the ground voltage level VSS during an inactivation period of the power-up signal PWRUP_PRE.

The internal voltage generating unit 330 of the integrated circuit generates an internal voltage in response to a control of the power-up signal PWRUP_PRE. That is, when the power-up signal PWRUP_PRE is activated, the internal voltage is maintained at the ground voltage level VSS. When the DPD mode is changed to the normal operation mode, the power-up signal PWRUP_PRE is activated to a logic high level, and the internal voltage generating unit 330 controlled by the power-up signal PWRUP_PRE stabilizes the internal voltage rapidly and may provide the internal voltage to an internal circuit. As mentioned above, because a configuration and operation of the integrated circuit in FIG. 3 except for the internal voltage generating unit 330 is the same as the configuration and operation of the power-up signal generating circuit shown in FIG. 2, any redundant description of the configuration and operation of the integrated circuit will be omitted herein.

While the present invention has been described with respect to the specific embodiments, it will be apparent to those skilled in the art that various changes and modifications may be made without departing from the spirit and scope of the invention as defined in following claims.

For example, an active high or an active logic low configuration for indicating an activation state of a signal and a circuit may be varied according to embodiments of the present invention. Moreover, a configuration of a transistor may be varied to implement the same function. That is, the PMOS transistor and NMOS transistor may be replaced and be implemented using various transistors. Furthermore, a configuration of a logic gate may be changed to implement the same function. That is, a NAND logic circuit, a NOR logic circuit may be configured with a combination of a NAND gate, a NOR gate and an inverter.

Specially, in embodiments of the present invention, a configuration using the internal reference voltage VREF_IN is described above, but the configuration of the present invention does not limit the internal reference voltage VREF_IN. Since the modification of this circuit may be implemented with various configurations, the detailed description will be omitted.

What is claimed is:
1. A power-up signal generating circuit, comprising:
a detecting unit configured to receive an internal reference voltage and a deep power down (DPD) signal and to output a bias signal having a voltage level corresponding to an external power voltage in response to the internal reference voltage and the DPD signal; and
a signal generating unit configured to generate a power-up signal having a logic level corresponding to the voltage level of the external power voltage in response to the DPD signal and the bias signal,
wherein the internal reference voltage increases during an activation time of the power-up signal to reach a predetermined voltage level after a predetermined time and maintains a ground voltage level during an inactivation period of the power-up signal,
wherein the signal generating unit includes
a third PMOS transistor coupled between a power voltage terminal and a second node and configured to be controlled by the DPD signal,
a second NMOS transistor coupled between the second node and a third node and configured to be controlled by the bias signal,
a first inverter configured to invert a signal output from the third node, and
a latch unit configured to latch an output signal of the first inverter in response to the DPD signal.

2. The power-up signal generating circuit of claim 1, wherein the detecting unit includes
a first PMOS transistor coupled between the power voltage terminal and an output terminal of the bias signal and configured to be controlled by the internal reference voltage;
a second PMOS transistor coupled between the output terminal of the bias signal and a first node and configured to be controlled by the DPD signal; and
a first NMOS transistor coupled between the first node and a ground voltage terminal and configured to be controlled by the internal reference voltage.

3. The power-up signal generating circuit of claim 1, wherein the latch unit includes
a NOR logic circuit configured to receive the DPD signal through a first input terminal thereof and to receive the output signal of the first inverter through a second input terminal thereof; and
a second inverter configured to invert an output signal of the NOR logic circuit and to output an inverted output signal to the second input terminal of the NOR logic circuit.

4. The power-up signal generating circuit of claim 3, wherein the signal generating unit further includes:
a third inverter configured to invert an output signal of the latch unit; and
a fourth inverter configured to invert an output signal of the third inverter.

5. An integrated circuit, comprising:
a detecting unit configured to receive an internal reference voltage and a deep power down (DPD) signal and to output a bias signal having a voltage level corresponding to an external power voltage in response to the internal reference voltage and the DPD signal;
a power-up signal generating unit configured to generate a power-up signal having a logic level corresponding to the voltage level of the external power voltage in response to the DPD signal and the bias signal; and
an internal voltage generating unit configured to generate the internal reference voltage in response to the power-up signal,
wherein the internal reference voltage increases during an activation time of the power-up signal to reach a predetermined voltage level after a predetermined time, and maintains a ground voltage level during an inactivation period of the power-up signal.

6. The integrated circuit of claim 5, wherein the detecting unit includes:
a first PMOS transistor coupled between a power voltage terminal and an output terminal of the bias signal and configured to be controlled by the internal reference voltage;
a second PMOS transistor coupled between the output terminal of the bias signal and a first node and configured to be controlled by the DPD signal; and a first NMOS transistor coupled between the first node and a ground voltage terminal and configured to be controlled by the internal reference voltage.

7. The integrated circuit of claim 6, wherein the power-up signal generating unit includes:
   a third PMOS transistor coupled between the power voltage terminal and a second node and configured to be controlled by the DPD signal;
   a second NMOS transistor coupled between the second node and a third node and configured to be controlled by the bias signal;
   a first inverter configured to invert a signal outputted from the third node; and
   a latch unit configured to latch an output signal of the first inverter in response to the DPD signal.

8. The integrated circuit of claim 7, wherein the latch unit includes:
   a NOR logic circuit configured to receive the DPD signal through a first input terminal thereof, and to receive the output signal of the first inverter through a second input terminal thereof; and
   a second inverter configured to invert an output signal of the NOR logic circuit and to output an inverted output signal to the second input terminal of the NOR logic circuit.

9. The integrated circuit of claim 8, wherein the power-up signal generating unit further includes:
   a third inverter configured to invert an output signal of the latch unit; and
   a fourth inverter configured to invert an output signal of the third inverter.

* * * * *